United States Patent [19]

Sugano

[11] Patent Number: 5,598,038
[45] Date of Patent: Jan. 28, 1997

[54] RESIN ENCAPSULATED SEMICONDUCTOR DEVICE

[75] Inventor: Yoichi Sugano, Tokyo, Japan

[73] Assignee: NEC Corporation, Japan

[21] Appl. No.: 569,312

[22] Filed: Dec. 8, 1995

Related U.S. Application Data

[63] Continuation of Ser. No. 336,262, Nov. 8, 1994, abandoned.

[30] Foreign Application Priority Data

Nov. 11, 1993 [JP] Japan .................. 5-305871

[51] Int. Cl.$^6$ .................. H01L 23/50; H01L 25/00
[52] U.S. Cl. .................. 257/787; 257/666; 257/676; 257/692; 257/680
[58] Field of Search .................. 257/676, 666.3, 257/66.4, 787, 667, 666, 692, 680

[56] References Cited

U.S. PATENT DOCUMENTS

| | | | |
|---|---|---|---|
| 5,084,753 | 1/1992 | Goida et al. | 252/666 |
| 5,245,215 | 9/1993 | Sawaya | 257/676 |
| 5,245,216 | 9/1993 | Saka | 257/676 |
| 5,291,060 | 3/1994 | Shimizu et al. | 257/667 |

FOREIGN PATENT DOCUMENTS

| | | | |
|---|---|---|---|
| 0054252 | 3/1984 | Japan | 257/666.4 |
| 0056950 | 3/1988 | Japan | 257/666.4 |
| 2-207561 | 8/1990 | Japan | H01L 23/50 |
| 0275655 | 11/1990 | Japan | 257/676 |
| 3-218059 | 9/1991 | Japan | H01L 25/07 |
| 0144142 | 5/1992 | Japan | 257/676 |

*Primary Examiner*—Sara W. Crane
*Assistant Examiner*—Alexander Oscar Williams
*Attorney, Agent, or Firm*—Hayes, Soloway, Hennessey, Grossman & Hage, P.C.

[57] ABSTRACT

A resin encapsulated semiconductor device is provided in which a plurality of semiconductor pellets are mounted on an island. The semiconductor device includes at least one window formed in the island between adjacent ones of the plurality of semiconductor pellets.

11 Claims, 4 Drawing Sheets

RESIN ENCAPSULATED SEMICONDUCTOR DEVICE

This is a continuation of U.S. patent application Ser. No. 08/336,262 filed on Nov. 8, 1994, now abandoned.

BACKGROUND OF THE INVENTION

1. Field of the Invention

The present invention relates to a semiconductor device and, more particularly, to the shape of an island of a resin encapsulated semiconductor device in which a plurality of semiconductor pellets are mounted on one island.

2. Description of the Related Art

An arrangement of a resin encapsulated semiconductor device obtained in accordance with a prior art technique will be described with reference to FIGS. 1 and 2.

FIG. 1 is a plan view of a conventional semiconductor device after wire bonding in which one package has one island and a plurality of pellets are mounted on this island, and FIG. 2 is a sectional view taken along the line II—II of FIG. 1.

Generally, to fabricate a resin encapsulated semiconductor device in which a plurality of pellets are mounted in one package, as shown in FIG. 1, a plurality of pellets 1 are mounted on one island 3. Then, the pellets 1 and inner leads 4 are bonded with each other through bonding wires 2, and one pellet 1 is directly bonded with other pellets 1 through bonding wires 2. Subsequently, the obtained structure is encapsulated with an encapsulating resin, as shown in FIG. 2.

Resin encapsulation will be described with reference to FIG. 2 (a sectional view taken along the line II—II of FIG. 1 which shows the flow of the resin during resin encapsulation).

The encapsulating resin which has gelled upon heating is injected through an encapsulating gate 5, as indicated by arrows of FIG. 2, to start filling.

The encapsulating resin injected from the encapsulating gate 5 flows as indicated by a "resin flow 6" shown in FIG. 2.

The encapsulating resin moves at a predetermined speed until reaching the pellets 1 and the island 3. Then, the flow of the encapsulating resin dividedly fills the portions above and under the island 3. The divided encapsulating resin flows merge after reaching the edge of the island 3 and the flow fills up to the end of the package, thereby completing resin encapsulation.

As a lead frame for mounting a semiconductor chip having a large area on its island, a lead frame having an island divided into a plurality of blocks that are connected with each other through bent portions is proposed (refer to Japanese Patent Application Laid-Open No. 2-207561).

When a semiconductor chip having a large area (size) is to be adhered on the island, since the island is divided into blocks, the stress generated by adhesion and the warp caused by the stress can be decreased.

Other than the above semiconductor devices, another conventional resin encapsulated semiconductor device is proposed, as shown in FIG. 3 (a plan view after wire bonding is completed, which explains another example of the prior art technique). According to this proposal, a plurality of semiconductor chips (pellets 1) are mounted on a plurality of islands 3 corresponding to the pellets 1. The plurality of pellets 1 are not directly bonded with each other, but are wire-bonded with each other through relay inner leads 4a (refer to Japanese Patent Application Laid-Open No. 3-218059).

In the conventional resin encapsulated semiconductor device shown in FIG. 3, the plurality of pellets 1 are not directly bonded with each other, but are wire-boned with each other through the relay inner leads 4a. In this case, a gap corresponding to at least two bonding wires 2 in the longitudinal direction is necessary between the adjacent pellets 1.

Since the number of the relay inner leads 4a is limited due to the limited space, the number of the bonding wires 2 among the pellets 1 is also limited accordingly, which is disadvantageous.

A lead frame for mounting the semiconductor chip, which uses an island divided into a plurality of blocks, aims at decreasing the stress generated upon adhering a semiconductor chip having a large area (size) and the warp caused by the stress, and does not "improve the resin flow during molding", which is the object of the present invention to be described later.

In the conventional resin encapsulated semiconductor device (a resin encapsulated semiconductor device in which a plurality of pellets are mounted on one island) shown in FIGS. 1 and 2, since a portion of the island 3 between the semiconductor chips 1 does not usually have a window, the distance after the resin is divided into portions above and under the island 3 and before merging is long. Thus, the resin filling speeds are different between the portions above and under the island 3. This degrades the filling balance, leading sometimes to floating or sinking of the island.

Also, when the island 3 is particularly thin, the speed of the resin to fill the portion above the island 3 is excessively decreased, so that the resin starts to set during filling. This may cause deformation of the bonding wires.

In addition, when large pellets are to be mounted as the pellets 1, the resin filling balance between the portions above and under the island 3 is not good. Then, floating, sinking, or deformation of the island 3, or deformation of the bonding wires may occur.

SUMMARY OF THE INVENTION

The present invention has been made in view of the problems and drawbacks of the conventional resin encapsulated semiconductor device described above, and has as its object to provide a resin encapsulated semiconductor device in which the flow of the resin during molding is improved, i.e., the resin filling balance between the portions above and under the island is improved, thereby preventing floating, sinking, or deformation of the island, or deformation of the bonding wires.

In order to achieve the above object, according to an aspect of the present invention, there is provided a resin encapsulated semiconductor device in which a plurality of semiconductor pellets are mounted on one island, comprising at least one window formed in the island between adjacent ones of the plurality of semiconductor pellets.

The window is formed as large as possible in accordance with sizes and shapes of the semiconductor pellets.

As is apparent from the aspect described above, the present invention is characterized in that a window is formed in the island of a semiconductor device. Then, the resin filling balance between the portions above and under the island is improved, thereby preventing floating, sinking, or deformation of the island, or deformation of the bonding wire.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF THE PREFERRED EMBODIMENTS

Figure 1:
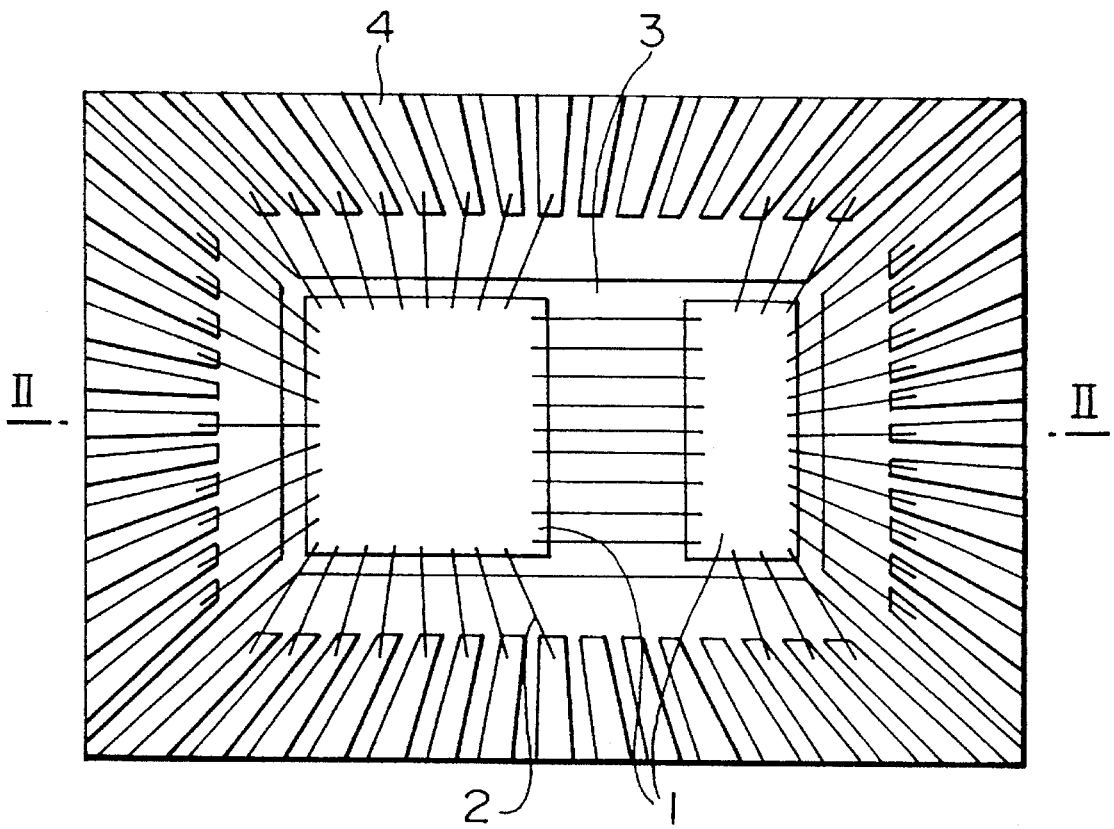
FIG. 1 is a plan view showing a conventional resin encapsulated semiconductor device after wire bonding.
Figure 2:
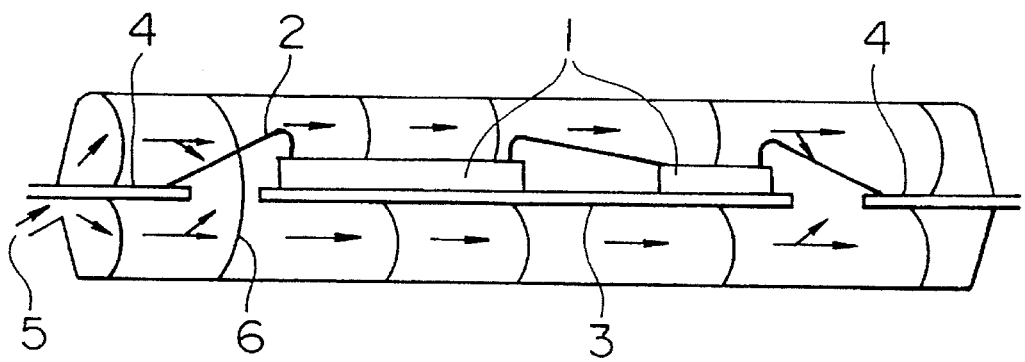
FIG. 2 is a sectional view taken along the line II—II of FIG. 1 and explains the flow of a resin during resin encapsulation.
Figure 3:
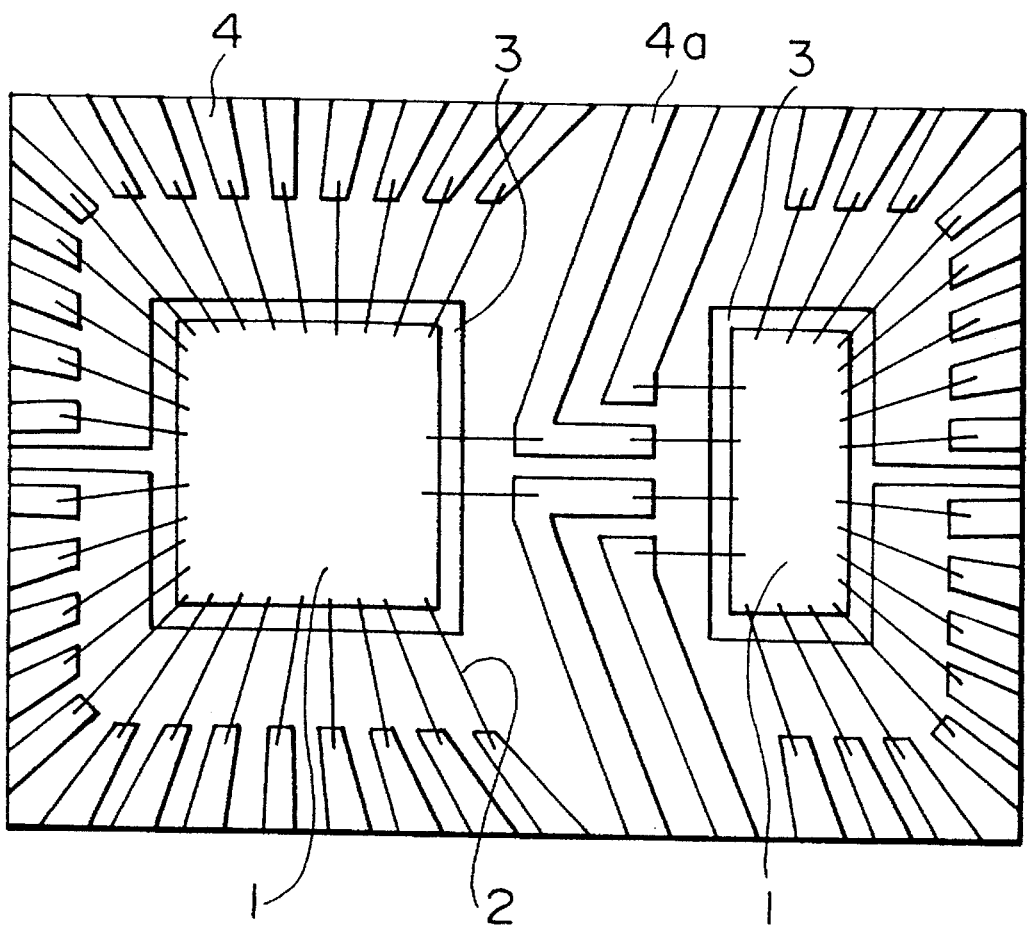
FIG. 3 is a plan view showing another conventional resin encapulated semiconductor device after wire bonding.
Figure 4:
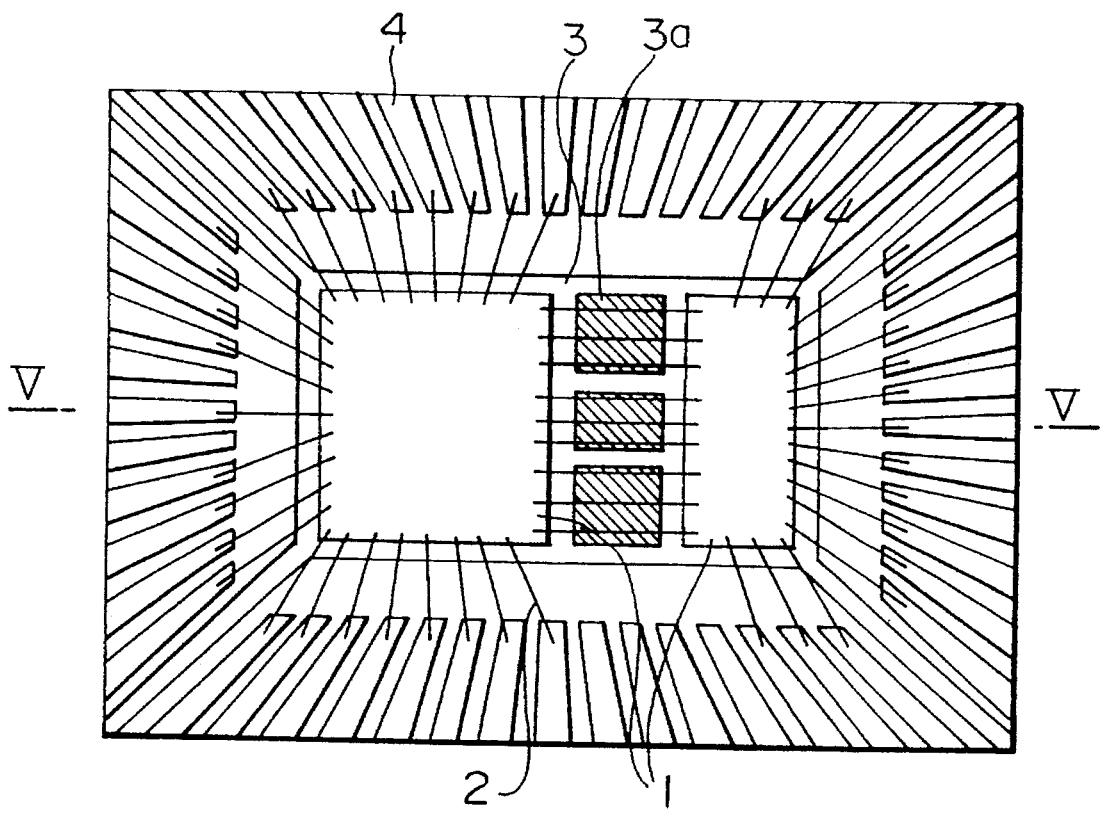
FIG. 4 is a plan view of a resin encapsulated semiconductor device after wire bonding according to the first embodiment of the present invention.
Figure 5:
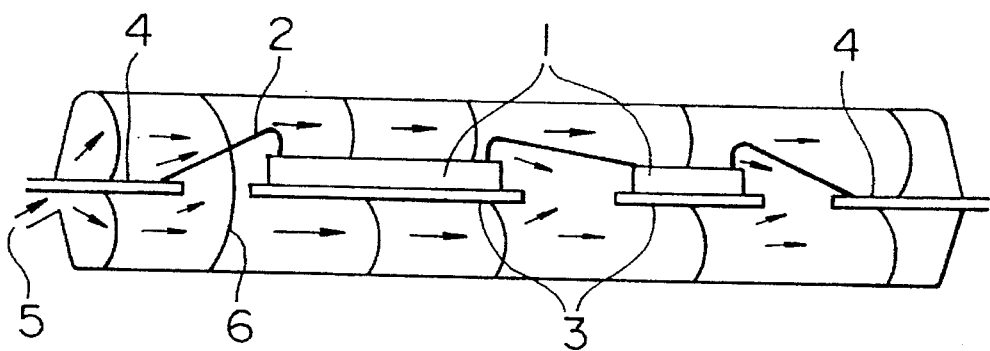
FIG. 5 is a sectional view taken along the line V—V of FIG. 4 and explains the flow of a resin during resin encapsulation.
Figure 6:
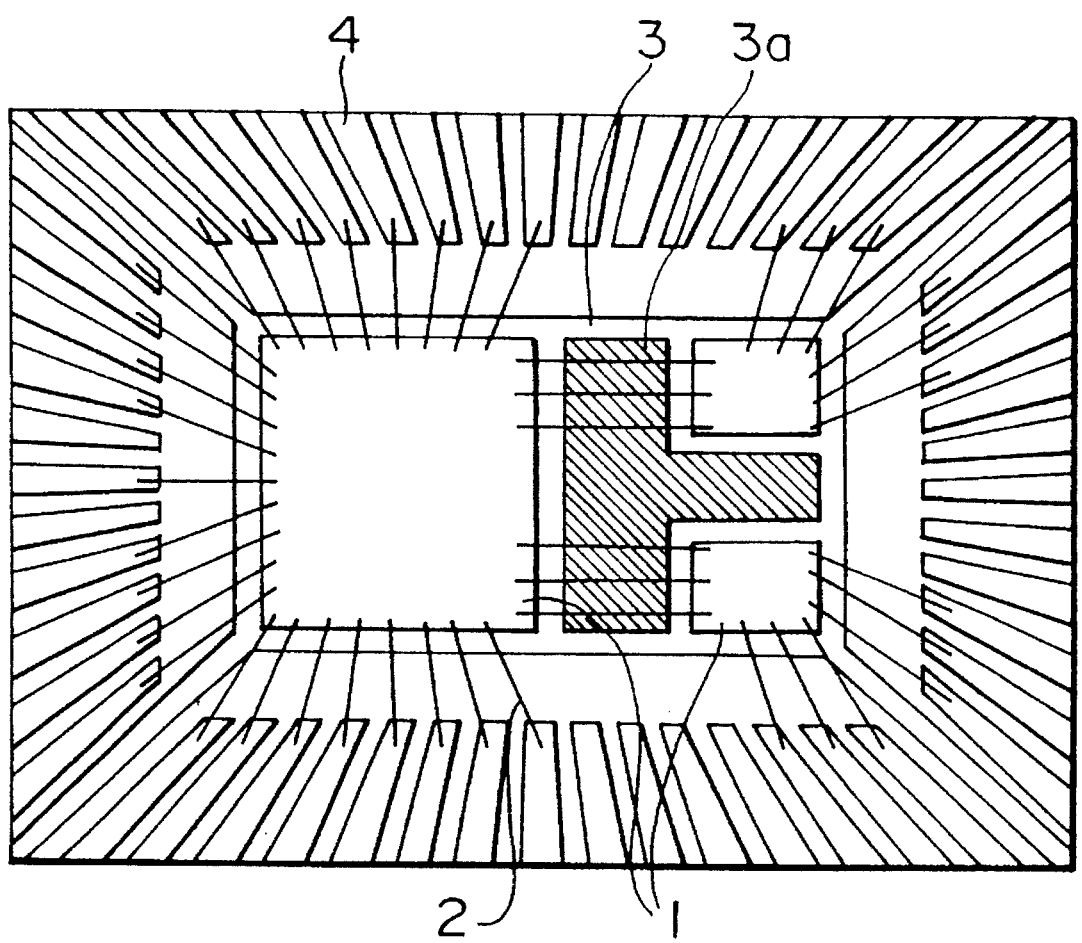
FIG. 6 is a plan view showing a resin encapsulated semiconductor device after wire bonding according to the second embodiment of the present invention.

The present invention will be described in more detail by way of several preferred embodiments shown in accompanying drawings (FIGS. 4 to 6).

FIG. 4 is a plan view after wire bonding to explain the first embodiment of the present invention, and FIG. 5 is a sectional view taken along the line V—V of FIG. 4 and shows the flow of a resin during resin encapsulation.

According to the first embodiment, as shown in FIG. 4, two pellets 1 are mounted on an island 3 having three windows 3a. The pellets 1 and inner leads 4 are bonded with each other through bonding wires 2, and one pellet 1 and the other pellet 1 are directly bonded with each other through bonding wires 2. Then, the obtained structure is encapsulated with an encapsulating resin.

The encapsulating resin is injected through an encapsulating gate 5, as shown in FIG. 5, to start filling. The encapsulating resin flows as indicated by a "resin flow 6" and moves at a predetermined speed until reaching the first pellet 1 and the island 3. Then, the flow of the encapsulating resin dividedly fills the portions above and under the island 3. The divided encapsulating resin flows merge at the windows 3a of the island 3.

Subsequently, the flow of the encapsulating resin is divided into toward portions above the second pellet 1 and under the island 3. The divided encapsulating resin flows merge after reaching the edge of the island 3, and the flow fills up to the end of the package, thereby completing resin encapsulation.

FIG. 6 is a plan view after wire bonding to explain the second embodiment of the present invention.

In the second embodiment, three pellets 1 are mounted on an island 3 having one large window 3a. The pellets 1 and inner leads 4 are bonded with each other through bonding wires 2, and one pellet 1 is directly bonded with other pellets 1 through bonding wires 2.

In the second embodiment, the window is designed as large as possible, when compared to the first embodiment, so that the encapsulating resin can flow smoother than that in the first embodiment.

What is claimed is:

1. A resin encapsulated semiconductor device, comprising three semiconductor pellets mounted adjacent to one another on respective portions of only one island in a lead frame assembly, and at least one window formed in said island between said semiconductor pellets, wherein said window is defined by a T-shaped void space in said island, and said semiconductor pellets are arranged around and separated by said window so as to leave connected together portions of said island on which said pellets are mounted.

2. A semiconductor device, comprising:

only one island having a first portion, a second portion, and a third portion, said third portion being in-between said first and second portions;

a first semiconductor pellet mounted on said first portion of said island;

a second semiconductor pellet mounted on said second portion of said island;

a window formed in said third portion of said island and being defined by a void space consuming most of said third portion, but leaving at least one part of said third portion joining said first and second portions together; and a resin encapsulating said one island and said first and second semiconductor pellets and filling said window.

3. A device according to claim 2, wherein said at least one window comprises a plurality of separate void spaces defining a respective plurality of windows arranged in a row between said first and second semiconductor pellets.

4. A semiconductor device, comprising:

only one island having a first portion, a second portion, and a third portion, said third portion being in-between said first and second portions;

a first semiconductor pellet mounted on said first portion of said island and having a first plurality of electrodes and a second plurality of electrodes;

a second semiconductor pellet mounted on said second portion of said island and having a third plurality of electrodes and a fourth plurality of electrodes;

a window formed in said third portion of said island and being defined by a void space consuming most of said third portion, but leaving at least one part of said third portion joining said first and second portions together;

a first plurality of inner leads;

a second plurality of inner leads;

a first plurality of wires bonding an associated one of said first plurality of electrodes to an associated one of said first plurality of inner leads;

a second plurality of wires bonding an associated one of said third plurality of electrodes to an associated one of said second plurality of inner leads;

a third plurality of wires bonding an associated one of said second plurality of electrodes to an associated one of said fourth plurality of electrodes; and a resin encapsulating said island, said first and second semiconductor pellets, said first and second pluralities of inner leads and said first, second and third pluralities of wires, and filling said window.

5. A device according to claim 4, wherein said at least one window comprises a plurality of void spaces defining a respective plurality of windows arranged in a row between said first and second semiconductor pellets.

6. A semiconductor device, comprising:

an island having a first portion, a second portion, and a third portion, said third portion being in-between said first and second portions;

a first semiconductor pellet mounted on said first portion of said island;

a second semiconductor pellet mounted on said second portion of said island;

a window formed in said third portion of said island and consuming most of said third portion, said window comprising a plurality of separate windows arranged in a row between said first and second semiconductor pellets; and, a resin encapsulating said one island and said first and second semiconductor pellets and filling said window.

7. A semiconductor device, and comprising:

an island having a first portion, a second portion, and a third portion, said third portion being in-between said first and second portions;

a first semiconductor pellet mounted on said first portion of said island and having a first plurality of electrodes and a second plurality of electrodes;.

a second semiconductor pellet mounted on said second portion of said island and having a third plurality of electrodes and a fourth plurality of electrodes;

a window formed in said third portion of said island and consuming most of said third portion, said window comprising a plurality of windows arranged in a row between said first and second semiconductor pellets;

a first plurality of inner leads;

a second plurality of inner leads;

a first plurality of wires bonding an associated one of said first plurality of electrodes to an associated one of said first plurality of inner leads;

a second plurality of wires bonding an associated one of said third plurality of electrodes to an associated one of said second plurality of inner leads;

a third plurality of wires bonding an associated one of said second plurality of electrodes to an associated one of said fourth plurality of electrodes; and a resin encapsulating said island, said first and second semiconductor pellets, said first and second pluralities of inner leads and said first, second and third pluralities of wires, and filling said window.

8. A semiconductor device, comprising:

only one island having a first portion, a second portion, and a third portion, said third portion being in-between said first and second portions;

a first semiconductor pellet mounted on said first portion of said island;

a second semiconductor pellet mounted on said second portion of said island;

a plurality of windows formed in said third portion of said island and being defined by a void space consuming moist of said third portion, but leaving at least one part of said third portion joining said first and second portions together; and a resin encapsulating said one island and said first and second semiconductor pellets and filling said plurality of windows.

9. A semiconductor device, comprising:

only one island having a first portion, a second portion, and a third portion, said third portion being in-between said first and second portions;

a first semiconductor pellet mounted on said first portion of said island and having a first plurality of electrodes and a second plurality of electrodes;

a second semiconductor pellet mounted on said second portion of said island and having a third plurality of electrodes and a fourth plurality of electrodes;

a plurality of windows formed in said third portion of said island and being defined by a void space consuming most of said third portion, but leaving at least one part of said third portion joining said first and second portions together;

a first plurality of inner leads;

a second plurality of inner leads;

a first plurality of wires bonding an associated one of said first plurality of electrodes to an associated one of said first plurality of inner leads;

a second plurality of wires bonding an associated one of said third plurality of electrodes to an associated one of said second plurality of inner leads;

a third plurality of wires bonding an associated one of said second plurality of electrodes to an associated one of said fourth plurality of electrodes; and a resin encapsulating said island, said first and second semiconductor pellets, said first and second pluralities of inner leads and said first, second and third pluralities of wires, and filling said plurality of windows.

10. A semiconductor device, comprising:

an island having a first portion, a second portion, and a third portion, said third portion being in-between said first and second portions;

a first semiconductor pellet mounted on said first portion of said island;

a second semiconductor pellet mounted on said second portion of said island;

a plurality of windows formed in said third portion of said island and consuming most of said third portion, said at least one of said plurality of windows comprising a plurality of separate windows arranged in a row between said first and second semiconductor pellets; and, a resin encapsulating said one island and said first and second semiconductor pellets and filling said plurality of windows.

11. A semiconductor device, and comprising:

an island having a first portion, a second portion, and a third portion, said third portion being in-between said first and second portions;

a first semiconductor pellet mounted on said first portion of said island and having a first plurality of electrodes and a second plurality of electrodes;

a second semiconductor pellet mounted on said second portion of said island and having a third plurality of electrodes and a fourth plurality of electrodes;

a plurality of windows formed in said third portion of said island and consuming most of said third portion, at least one of said plurality of windows comprising a plurality of separate windows arranged in a row between said first and second semiconductor pellets;

a first plurality of inner leads;

a second plurality of inner leads;
a first plurality of wires bonding an associated one of said first plurality of electrodes to an associated one of said first plurality of inner leads;
a second plurality of wires bonding an associated one of said third plurality of electrodes to an associated one of said second plurality of inner leads;
a resin encapsulating said island, said first and second semiconductor pellets, said first and second pluralities of inner leads and said tint, second and third pluralities of wires, and filling in said plurality of windows.

* * * * *

UNITED STATES PATENT AND TRADEMARK OFFICE
CERTIFICATE OF CORRECTION

PATENT NO. : 5,598,038
DATED : January 28, 1997
INVENTOR(S) : Yoichi Sugano

It is certified that error appears in the above-indentified patent and that said Letters Patent is hereby corrected as shown below:

Claim 8, Col. 5, Line 62, "moist" should be --most--.

Claim 11, Col. 7, Line 7, after "leads;" insert --a third plurality of wires bonding an associated one of said second plurality of electrodes to an associated one of said fourth plurality of electrodes; and--.

Claim 11, Col. 8, Line 3, "tint" should be --first--.

Signed and Sealed this

Sixth Day of May, 1997

Attest:

BRUCE LEHMAN

Attesting Officer        Commissioner of Patents and Trademarks